United States Patent [19]

Hatzakis et al.

[11] 4,142,107
[45] Feb. 27, 1979

[54] RESIST DEVELOPMENT CONTROL SYSTEM

[75] Inventors: Michael Hatzakis, Ossining; Constantino Lapadula, Mahopac; Burn J. Lin, Katonah, all of N.Y.

[73] Assignee: International Business Machines Corporation, Armonk, N.Y.

[21] Appl. No.: 811,758

[22] Filed: Jun. 30, 1977

[51] Int. Cl.² .................................................. G01N 21/30
[52] U.S. Cl. .......................................... 250/571; 96/36
[58] Field of Search ........................ 96/36, 90; 250/550, 250/559, 571, 572

[56] References Cited
U.S. PATENT DOCUMENTS
3,922,093  11/1975  Dandliker et al. ................... 250/571

Primary Examiner—David C. Nelms
Attorney, Agent, or Firm—Graham S. Jones, II

[57] ABSTRACT

In the process of developing exposed photoresist on a substrate, the endpoint in developing away all of the exposed positive photoresist or any other positive resist is detected by exposing a wafer with a predetermined pattern including an optical grating or other special pattern formed in the photoresist upon a test area. In a system employing this concept, a beam is diffracted by the optics of the grating only at a first angle until the resist forming the grating is removed by development. Then a sensor is activated when an angle of reflection is unblocked when the grating disappears. The system is then turned off to stop development by the sensor in an automatic system or, by the operator in a manual system. A double exposure technique is employed to produce the grating or other special pattern.

16 Claims, 9 Drawing Figures

PATTERN AREA

TEST AREA

RESIST DEVELOPMENT CONTROL SYSTEM

BACKGROUND OF THE INVENTION

1. Field of the Invention

This invention relates to determining the endpoint of development of photoresist, electron beam resist, X-ray resist and the like. More particularly, this invention relates to a system for controlling the end of development of a resist when a test pattern disappears.

2. Prior Art

Price, "Etch End-Point Detector," IBM Technical Disclosure Bulletin 15, 3532–3533 (1973) shows a laser source directed onto a metal or oxide film being etched from the surface of a wafer. Monochromatic laser light is transmitted to the wafer through fibers in light pipes to the wafer. Light reflected from the wafer is fed through other fibers in light pipes to a detector. Because of interference phenomena, the reflected signal varies in a sinusoidal manner as the film thickness changes during etching. A detector filters and differentiates that signal to produce an output which goes to zero as etching is completed.

U.S. Pat. No. 3,874,959 of Hoekstra et al entitled, "Method to Establish the Endpoint During Delineation of Oxides on Semiconductor Surfaces and Apparatus Therefor," describes a technique for detecting the endpoint of etching away a dielectric by sensing the amount of current passing through a substrate on which the dielectric is deposited in response to a pulsating light beam. The dielectric is in the form of an oxide which is highly resistant to electrical current, but which is etched away to permit current flow.

U.S. Pat. No. 3,669,673 of Ih et al entitled, "Recording of a Continuous Tone Focused Image on a Diffraction Grating," describes forming an image with a diffraction grating coated with photoresist. The purpose, however, was simply to record a holographic image in the grating pattern for displaying a hologram later. It has nothing to do with endpoint detection.

U.S. Pat. No. 3,622,319 of Sharp for "Nonreflecting Photomasks and Methods of Making Same" shows an array of opaque lines of a mask and optical patterns generated by reflection of light. This deals with a method of making a mask and has nothing to do with endpoint detection.

U.S. Pat. No. 3,728,117 of Heidenhain et al entitled, "Optical Diffraction Grid," shows production of diffraction gratings photographically, and has nothing to do with endpoint detection.

U.S. Pat. No. 3,708,229 of Pircher for a "System for Measuring Optical Path Length Across Layers of Small Thickness" describes an interferometery technique for measuring the thickness of a layer. It monitors the thickness of a thin film.

Automatic endpoint detection has been performed by means of projecting a beam of light at a thin film pattern at a predetermined angle to a thin film and placing a detector in line with the reflected light to monitor standing waves of diminishing amplitude caused by the reflected waves from the photoresist-air and photoresist-substrate interfaces.

Recent advances in lithography systems require minimum feature dimensions in the submicron region. Conventional development inspection with optical microscopes reveals large defects such as severely distorted images due to sizable mask-to-wafer gap, distinctly overexposed or underexposed areas due to significant variation of illumination intensity, and large micron-size defects. However, it is impossible to observe precisely the change of the submicron linewidths or to determine the complete removal of residual resist material in the exposed areas when they are on the order of ¼ micron wide with 1000 Angstrom spaces between T and I bars. In such a case, it is impossible to see when development is completed. Because of long turnaround time and the unavoidable destructive exposure of a sample to radiation, the high resolution capability of scanning electron microscopy (SEM) cannot be utilized except for the purpose of monitoring occasional samples in a manufacturing system. It is preferred to test for development on each and every wafer.

An object of this invention is to enable submicron linewidth control with a low power microscope. It is applicable for electron-beam, X-ray, or photographic lithography as long as a positive resist is used.

A further object of this invention is to ensure complete removal of photoresist residue during development.

Another object of this invention is in situ inspection of the state of development of a sample during a process of photoresist development.

In accordance with this invention a manufacturing system is provided for controlling development of a resist pattern on a film of resist deposited on a substrate including a film of resist exposed to a pattern in a first area of its surface and exposed in a monitoring area of its surface to a pattern with a different degree of exposure and means for optically monitoring the monitoring area during development of the resist to determine when the resist has been substantially removed from the monitoring area to provide a signal indicating a shift in light intensity reaching a predetermined location for the purpose of providing an indication of the endpoint of development of the pattern upon the first portion.

Further, in accordance with this invention, a small test area on a wafer is blanket exposed independently from the exposure of a pattern projected onto the entire wafer. Preferably, the amount of blanket exposure in the small area is held to a fixed relationship with a low power microscope. When the patterns in the test area disappear completely, the desired level of development has been accomplished.

DESCRIPTION OF THE PREFERRED EMBODIMENT

Figure 1A:
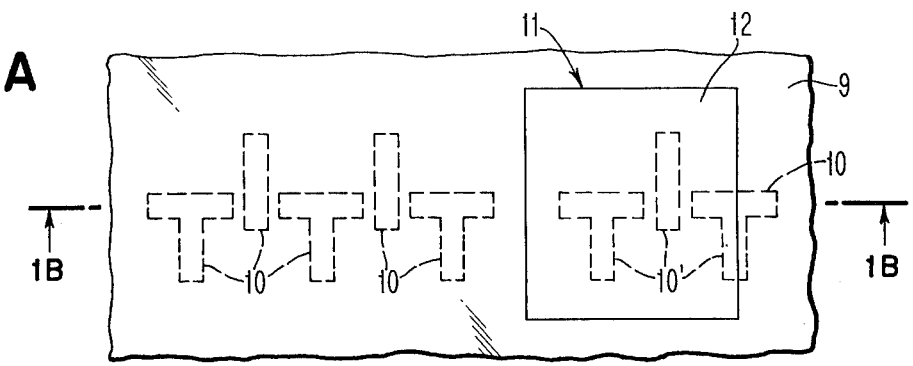
FIG. 1A shows a plan view of a photoresist layer having been exposed to two patterns of radiation with a test area which has been partially double-exposed.
Figure 1B:
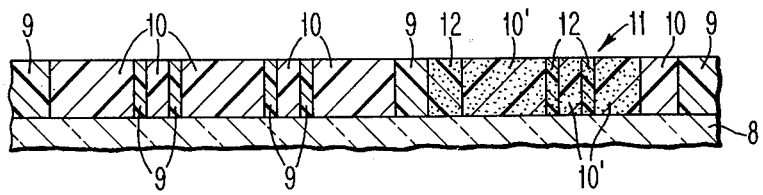
FIGS. 1B–1E show sectional views along line 1B—1B in FIG. 1A after exposure in FIG. 1B, after an early stage of development in FIG. 1C, after development is nearly finished in FIG. 1D, and after the development endpoint has been reached in FIG. 1E.

FIG. 1A shows a top view of layer 9 of positive photoresist exposed to a T and I bar pattern for forming a bubble memory device in photoresist layer 9 on a surface of a substrate 8 composed of a metal, silicon, etc., depending upon the method of forming the pattern employed. The exposed area of resist in the form of cross-sections of T and I bars is shown in FIG. 1B by hatched line patterns 10 and 10' in a sectional view taken along line 1B—1B in FIG. 1A. A test pattern area 11 is exposed separately from the exposure of the T and I bar pattern in a blanket exposure shown stippled with dots. Portions 10' of area 11 have received double exposure as a result of flood or blanket exposure of all of area 11. The T and I bar patterns 10' within area 11 are shown in FIG. 1B stippled with dots plus hatch lines, indicating that they are double exposed, since they received about twice the exposure to radiation of the frequency to which they are sensitive as have the majority of T and I bar patterns 10 outside of test pattern area 11. The portion of area 11 outside of T and I bar patterns 10' will be referred to as the conjugate area 12 of T and I bar patterns 10'. The conjugate 12 of T and I bar patterns 10' in the test area 11 receives a similar level of exposure as do the majority of T and I bar patterns 10 and will develop at about the same rate as a result.

Figure 1C:
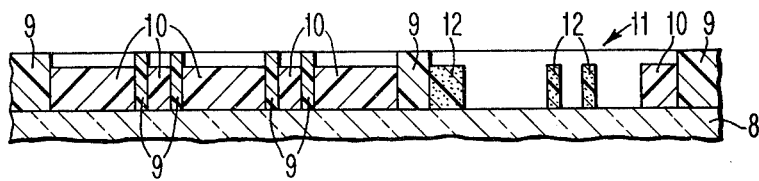
Figure 1D:
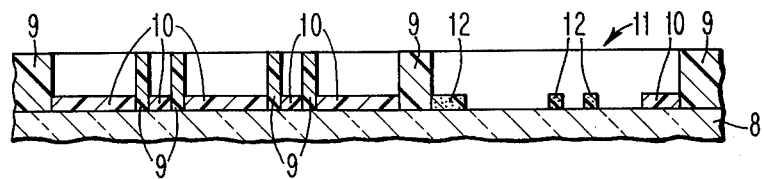
Figure 1E:
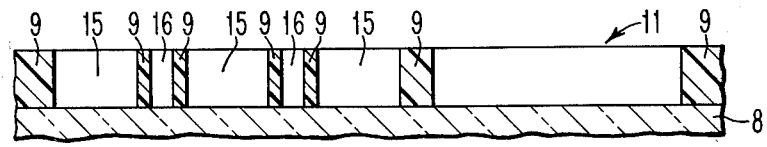

During development, the double-exposed photoresist 9 in the T and I bar patterns 10' in the test area 11 is quickly removed as shown in FIG. 1C after an early stage of development because of the heavy level of overexposure which reduces the amount of time required for development of the resist employed. However, the photoresist in the conjugate area 12 of the T and I bar patterns 10' in the test area received similar exposure as the T and I bar patterns 10 outside. Therefore, it is developed at the same slower rate as those T and I bar patterns 10. Development of patterns 10 and conjugate area 12 is almost finished in FIG. 1D. When the resist patterns 10 and 10' exposed develop completely as in FIG. 1E, the test pattern area 11 is cleared of all of its photoresist 9. With use of this technique the usual prior art task of inspecting through the openings in the patterns 10 for resist residue can be transformed to detecting the disappearance of a pattern only in the test pattern area 11. The variation in photoresist thickness, spectral distribution of illumination, spectral sensitivity of photoresist, spectral reflectivity of the substrate, and development consistency of developer are all taken into account. In FIG. 1E the T-bar patterns 15 and the I-bar patterns 16 are shown as in the test area 11 with all exposed resist areas 10, 10', and 12 removed.

Figure 2:
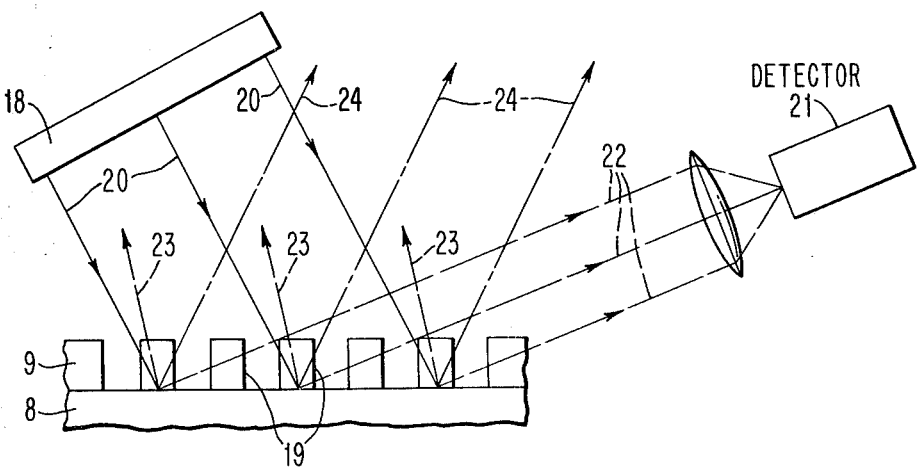
FIG. 2 shows a similar view to FIG. 1C with the test area shown to show the angles of the light beam in the presence and absence of a resist grating.

An embodiment of this invention adapted for automatic inspection is proposed as in FIG. 2. A photoresist grating 19 for area 11 in FIGS. 1A–E with periodicity twice the minimum feature size on the mask is used in the test area 11 instead of T and I bars 10' which are spaced irregularly but which are suitable for usual visual detection in a microscope. During development, an incident laser beam 20 from laser source 18 is strongly diffracted into the first order directions 22, 23. A detector 21 monitors this signal to stop development when the gating in area 11 develops to such a degree that the signal decreases to a preset value as diffraction shifts to the zeroth order reflected beam angle 24. Alternatively, a human operator can monitor the reflected beam to stop development.

This system performs well compared to the prior interference technique because of the absence of the extra complication of a layer of slowly dissolving unexposed photoresist. In addition, it continues to monitor linewidth after all resist residue is cleared in FIG. 1C, while the conventional system stops after all exposed resist is removed. To develop beyond residual removal in the conventional system, a preset overdevelopment which does not react to actual exposure conditions is needed. Thirdly, this system does not suffer from undetectable signal due to low substrate reflectivity.

It should be noted that source 18 is described as a laser although other sources could be employed such as any monochromatic, noncoherent light sources. Monochromatic light will avoid producing a rainbow of diffraction angles. Polychromatic light could be used with plural filtered detectors to sense color change. In addition, source 18 emits light in the red portion of the spectrum for ordinary photoresist which is insensitive to red light. Analogously, for resists sensitive to other spectra such as X-rays, source 18 will transmit radiation in a spectrum range to which X-ray, E-beam, etc. sensitive resists are insensitive to avoid incidental exposure of the pattern by the monitoring beam.

SUMMARY

Visual inspection and automatic endpoint detection of residual photoresist is made easy and reliable with this method. It is applicable to ultraviolet, X-ray, and E-beam exposure systems and any other kind of exposure system.

This method assures development of a resist pattern by first exposing a pattern upon a first portion of a substrate coated with resist, then exposing a monitoring area to a different degree of exposure and finally monitoring the monitoring area during development to determine when the resist has been removed from the monitoring area. Alternatively, the monitoring area can be exposed first.

The endpoint in developing away all of the exposed positive photoresist or other resist is detected by exposing a wafer with a predetermined pattern including an optical grating upon a monitoring area. A beam is diffracted by the grating at a first order angle of diffraction until the grating is removed by development. Then a sensor is activated by the angle of diffraction which results.

When developing positive photoresist, a major problem is the ensurance of complete removal of resist from the part of the wafer that is exposed. The problem is severe when a transparent wafer is inspected because the photoresist has a refractive index similar to that of the wafer. Thus, it is difficult to distinguish between the residue of photoresist and the wafer.

Figure 4:
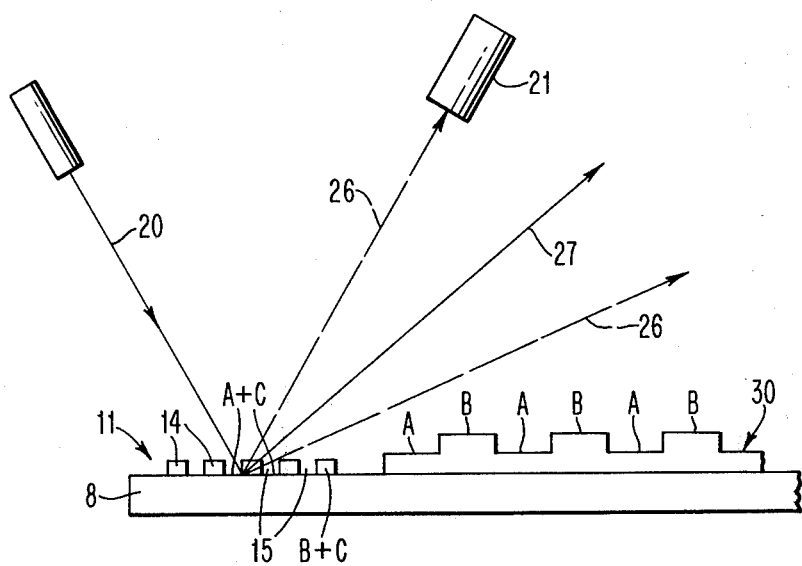
FIG. 4 shows the contour of a wafer with areas as in FIG. 3A and a test area as in FIG. 3B with a sensor system similar to that of FIG. 2.

In FIG. 4 the wafer 8 with photoresist 30 is first exposed with a working mask which contains all pertinent patterns for a device and which includes a small monitoring area 11 consisting of predetermined test patterns such as an optical grating or T and I bars in the regular pattern. Then only the monitoring area 11 is reexposed with a mask that is opaque in the device area for an exposure time identical to, or slightly less than, that of the first exposure. Next the resist 30 on wafer 8 is developed. The doubly exposed monitoring area 11 can be inspected for complete removal of the test patterns (grating) during development.

Figure 3A:
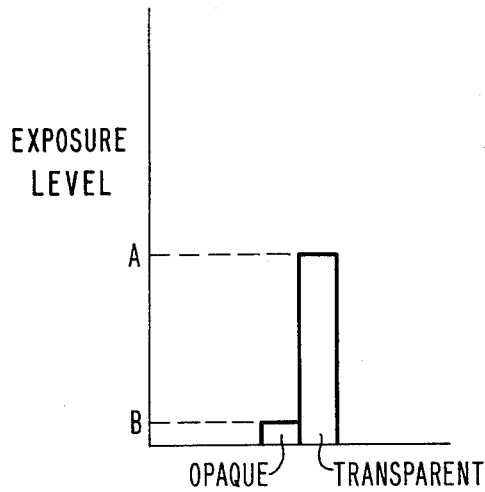
FIG. 3A shows the relative degree of exposure level for the pattern area of a layer of resist for the open portions of an exposure mask providing exposure level A and the closed portions of an exposure mask providing exposure level B.
Figure 3B:
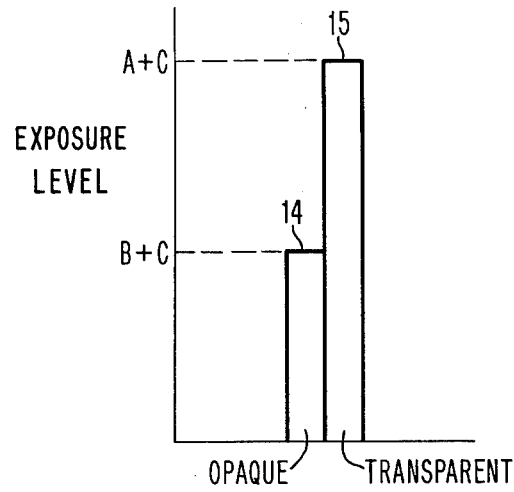
FIG. 3B shows the relative degree of exposure level of a resist layer for a test exposure area of double exposure wherein the levels A and B are provided during a first exposure through a mask followed by blanket exposure with level C leading to sums of exposure level of B + C and A + C.

FIG. 3A shows the levels of exposure of resist 30 in FIG. 4 to radiation level A through the transparent portions in the mask and lower exposure levels B for the opaque portions of the mask (due to scattering of light). For the test area 11, wherein the exposure levels A and B are applied first, as shown in FIG. 3B, the subsequent blanket exposure of area 11 with radiation at exposure level C (which is nearly equal to level A) leads to exposure levels of B + C and A + C. FIG. 4 shows the resist structure during development and structures produced for exposure levels of B + C and A + C are shown in area 11 as well as the structures for levels A and B to the right.

The relative magnitudes of levels A and B correspond to a mask contrast ratio which can easily be over 100. Therefore, level B can be over two orders of magnitude smaller than level A. During development, the areas 15 of test area 11 with exposure level A + C are cleared of resist 30 very quickly while if C is selected so that A about equals B + C, then the resist exposed to A to form device patterns will develop almost at the same time as B + C. Therefore, the test pattern remains visible or detectable until development has been completed in areas A between the areas B, as has been confirmed by SEM analysis.

If B + C is reduced, then endpoint occurs later, so the development process will produce larger line openings. If B + C is increased, the reverse occurs.

For further clarity of understanding, an alternative description of this technique as applied to automatic endpoint detection illustrated by FIGS. 3A, 3B, and 4 is included. It also uses a reflected laser beam 20 which quickly reduces to zero amplitude, giving a distinctive signal at the monitor 21 when the test pattern grating disappears.

A laser beam 20 shines upon the test pattern area 11 on a partially developed wafer 8 which includes ridges (exposure level A) and valleys (exposure level 2A). When the ridges develop completely, there is not first order reflected light along lines 26, and light is directed along a line 27 for specularly reflected light. Then sensor 21 will indicate that no light is being transmitted to it, so developing ends. The resist 30 in the main portion of the wafer 8 is shown with high portions and low portions having received exposure levels of B and A, respectively, part way through development, so that the areas exposed to exposure level A will eventually be developed at the same time as the ridges of grating 19.

The first order beam 26 can also be detected by an optical Fourier transform arrangement with the zeroth order component filtered, i.e., putting an opaque circle at the focal point of a lens placed in the direction of the specularly reflected beam. The detector 21 can then be positioned with a collection lens behind the focal point of the first lens.

The predetermined patterns can be designed for different purposes. For example, it may be 10 micron lines spaced 10 microns apart so that the linewidth is sufficiently wide for low power microscopic inspection. In addition, the diffraction focusing effect is moderate in this linewidth. Therefore, at the center between lines, the intensity of the diffraction image is equivalent to that of a large uniform background. Complete removal of the photoresist line patterns in the test area determines the ratio of the blanket exposure level to the pattern exposure level which is used as a universal reference ratio independent of the geometry of the device.

To optimize for automatic endpoint detection, the predetermined pattern is a grating of suitable spatial frequency that causes the first order reflected laser beam to orient much differently from the specularly reflected beam, as seen in FIG. 4. When the refractive index of the substrate is similar to that of the photoresist, the usual way of endpoint detection by observing the standing wave pattern is difficult, whereas the above described method is highly effective.

The test pattern can also be the device pattern or the inverse of the device pattern for convenience of mask generation.

It is obvious that this invention applies for development inspection of any kind of exposure systems such as deep ultraviolet, X-ray, electron beam, and conventional optical exposure systems as long as positive resists are used.

What is claimed is:

1. A manufacturing system for controlling development of a resist pattern on a film of resist deposited upon a substrate including
   a film of a developing resist exposed to a pattern in a first area of its surface and exposed in a monitoring area of its surface to a diffraction grating pattern with a different degree of exposure, and
   means for optically monitoring the monitoring area during development of said resist to determine when the resist has been substantially removed from the monitoring area to provide a signal indicating a shift in light intensity reaching a predetermined location for the purpose of providing an indication of the endpoint of development of said pattern upon said first portion.

2. A system in accordance with claim 1 wherein said pattern in said monitoring area comprises a grating pattern exposed in response to development of said resist, and
   said means for monitoring comprises a sensor and a monochromatic source of light directed onto said monitoring area for reflection of a light from said source of light to said sensor from said area as a function of the presence of said grating pattern,
   whereby said sensor provides radically different angles of reflection as a function of the development of said grating pattern.

3. A system in accordance with claim 2 wherein said grating pattern diffracts said radiation to a direction in which it reaches said detector only until said grating pattern is developed away.

4. A system in accordance with claim 1 wherein said means for optically monitoring comprises a laser beam directed at said monitoring area and a sensor located to receive a diffracted reflection of said laser beam during the process of development of said monitoring area, with said diffracted reflection ending upon total development of said monitoring area substantially to terminate reflection of said laser beam upon said sensor.

5. A system in accordance with claim 1 wherein said resist has been subjected to a double exposure in said monitoring area with one of the exposures being a flooding of the entire monitoring area with exposure.

6. A system in accordance with claim 2 wherein said resist has been subjected to a double exposure in said monitoring area with one of the exposures being a flooding of the entire monitoring area with exposure.

7. A system in accordance with claim 4 wherein said resist has been subjected to a double exposure in said monitoring area with one of the exposures being a flooding of the entire monitoring area with exposure.

8. A system in accordance with claim 1 wherein said monitoring area of said resist has been exposed in a pattern-exposing step to an exposure level A and other areas of said resist have been exposed to exposure level B from miscellaneous sources, and said monitoring area has been additionally flood-exposed in a flood-exposing step to exposure level C, whereby portions of said predetermined area have received exposure levels of A + C and B + C, where C was selected such that exposure level A was approximately equal to the sum of exposure levels B and C, whereby the times of completion of development of resist areas exposed to level A and levels B + C occur substantially simultaneously.

9. A system in accordance with claim 3 wherein said monitoring area of said resist has been exposed in a pattern-exposing step to an exposure level A and other areas of said resist have been exposed to exposure level B from miscellaneous sources, and said monitoring area has been additionally flood-exposed in a flood-exposing step to exposure level C, whereby portions of said predetermined area have received exposure levels of A + C and B + C, where C was selected such that exposure level A was approximately equal to the sum of exposure levels B and C, whereby the times of completion of development of resist areas exposed to level A and levels B + C occur substantially simultaneously.

10. A system in accordance with claim 4 wherein said monitoring area of said resist has been exposed in a pattern-exposing step to an exposure level A and other areas of said resist have been exposed to exposure level B from miscellaneous sources, and said monitoring area has been additionally flood-exposed in a flood-exposing step to exposure level C, whereby portions of said predetermined area have received exposure levels of A + C and B + C, where C was selected such that exposure level A was approximately equal to the sum of exposure levels B and C, whereby the times of completion of development of resist areas exposed to level A and levels B + C occur substantially simultaneously.

11. A manufacturing apparatus for detecting presence of a diffraction grating pattern in a monitoring area including,
a substrate with a diffraction grating pattern formed thereon,
means for optically monitoring said monitoring area to determine whether said diffraction grating is present in said monitoring area by providing a signal indicating a shift in light intensity reaching a predetermined location as a function of the presence of said diffraction grating pattern in said monitoring area.

12. A manufacturing apparatus for detecting a diffraction grating pattern in a film of a resist deposited upon a substrate including
a substrate with a film of a resist having a monitoring area with a diffraction grating pattern thereon,
means for optically monitoring said monitoring area to determine whether said diffraction grating pattern is present in said monitoring area, and
said means for monitoring providing a signal indicating a shift in light intensity reaching a predetermined location as a function of the presence of said diffraction grating pattern in said monitoring area.

13. Apparatus in accordance with claim 12 wherein said diffraction grating pattern in said monitoring area comprises a grating pattern produced in said resist, and
said means for monitoring comprises a sensor and a monochromatic source of light directed onto said monitoring area for reflecting light from said source of light to said sensor from said area as a function of the presence of said grating pattern,
whereby said sensor provides radically different angles of reflection as a function of the development of said grating pattern.

14. Apparatus in accordance with claim 12 wherein said means for optically monitoring comprises a laser beam directed at said monitoring area and a sensor located to receive a diffracted reflection of said laser beam during the presence of said grating in said monitoring area, with said diffracted reflection ending upon the absence of said grating from said monitoring area effective substantially to terminate reflection of said laser beam upon said sensor.

15. A manufacturing apparatus for controlling development as a resist pattern on a film of resist deposited upon a substrate including
said substrate and said film of a developing resist previously exposed to a pattern in a first area of its surface and having a relatively thin film diffraction grating pattern formed by said resist in a monitoring area of its surface, and
means for optically monitoring said monitoring area during development of said resist to determine when the resist has been substantially removed from the monitoring area to provide a signal indicating a shift in light intensity reaching a predetermined location for the purpose of providing an indication of the endpoint of development of said pattern upon said first portion.

16. Apparatus in accordance with claim 15 wherein said diffraction grating pattern in said monitoring area comprises a grating pattern previously developed in response to preliminary development of said resist, and
said means for monitoring comprising a sensor and a monochromatic source of light directed onto said monitoring area for reflection of light from said source of light to said sensor from said area as a function of the presence of said grating pattern,
whereby said sensor provides radically different angles of reflection as a function of the development of said grating pattern.

* * * * *